US012586962B2

(12) United States Patent
Frid et al.

(10) Patent No.: US 12,586,962 B2
(45) Date of Patent: Mar. 24, 2026

(54) ELECTRICAL CONNECTORS WITH INTEGRAL FAULT DETECTION AND INDICATION

(71) Applicant: Leviton Manufacturing Co., Inc., Melville, NY (US)

(72) Inventors: Eugene Frid, Great Neck, NY (US); Constantin Diac, Glen Cove, NY (US); John Garbarino, Freeport, NY (US); Vikramsinh P. Bhosale, Westbury, NY (US); Michael Calamita, Hampton Bays, NY (US)

(73) Assignee: Leviton Manufacturing Co., Inc., Melville, NY (US)

( * ) Notice: Subject to any disclaimer, the term of this patent is extended or adjusted under 35 U.S.C. 154(b) by 463 days.

(21) Appl. No.: 18/245,012

(22) PCT Filed: Dec. 21, 2022

(86) PCT No.: PCT/US2022/082104
§ 371 (c)(1),
(2) Date: Mar. 13, 2023

(87) PCT Pub. No.: WO2023/133041
PCT Pub. Date: Jul. 13, 2023

(65) Prior Publication Data
US 2024/0243528 A1 Jul. 18, 2024

Related U.S. Application Data

(60) Provisional application No. 63/297,309, filed on Jan. 7, 2022.

(51) Int. Cl.
*H01R 13/66* (2006.01)
*G01K 1/02* (2021.01)
(Continued)

(52) U.S. Cl.
CPC ......... *H01R 13/6683* (2013.01); *G01K 1/026* (2013.01); *G01R 31/52* (2020.01); *H01R 13/7175* (2013.01); *H01R 2105/00* (2013.01)

(58) Field of Classification Search
CPC . H01R 13/6683; H01R 13/7175; G01R 31/52
See application file for complete search history.

(56) References Cited

U.S. PATENT DOCUMENTS 5,188,542 A * 2/1993 Ballman ............ H01R 13/6683
439/465
7,086,892 B2 8/2006 Tanacan et al.
(Continued)

OTHER PUBLICATIONS

International Search Report & Written Opinion for PCT Application No. PCT/US2022/082104, dated Mar. 16, 2023 (15 pages) (Year: 2023).

*Primary Examiner* — Scott Bauer
(74) *Attorney, Agent, or Firm* — Kevin P. Radigan, Esq.; Heslin Rothenberg Farley & Mesiti P.C.

(57) ABSTRACT

Electrical connectors with integral fault detection are provided. The connectors are adapted to be coupled to AC multi-phase electrical cables, and can include a plurality of phase contacts, a detector, and an indicator. The phase contacts include a first phase contact, a second phase contact, and a third phase contact to receive a first phase, a second phase, and a third phase, respectively, of the electrical cable. The detector is configured to monitor a first temperature associated with the first phase contact, a second temperature associated with the second phase contact, and a third temperature associated with the third phase contact to detect a temperature fault at any of the contacts. The indicator is operatively coupled to the detector and is configured to indicate presence of the temperature fault.

19 Claims, 12 Drawing Sheets

(51) Int. Cl.
    *G01R 31/52*        (2020.01)
    *H01R 13/717*     (2006.01)
    *H01R 105/00*     (2006.01)

(56)                  References Cited

U.S. PATENT DOCUMENTS

| | | | |
|---|---|---|---|
| 7,168,974 | B2 | 1/2007 | Feldman et al. |
| 10,432,258 | B1 * | 10/2019 | Mitchell ................. B60L 53/30 |
| 2005/0018371 | A1 | 1/2005 | Mladenik et al. |
| 2009/0160663 | A1 * | 6/2009 | Silverman ........... H02H 11/001 |
| | | | 340/654 |
| 2012/0032810 | A1 | 2/2012 | Chillar et al. |
| 2013/0190968 | A1 | 7/2013 | Nitzberg et al. |
| 2014/0168830 | A1 * | 6/2014 | Vangool ................. H02H 3/338 |
| | | | 361/47 |
| 2015/0109077 | A1 | 4/2015 | Tomimbang et al. |
| 2015/0171567 | A1 * | 6/2015 | Kawamoto ............ H01R 24/30 |
| | | | 439/620.21 |
| 2017/0336265 | A1 | 11/2017 | Sato et al. |
| 2018/0034291 | A1 * | 2/2018 | Wang ..................... H02H 5/042 |
| 2020/0321735 | A1 * | 10/2020 | Jahn ................... H01R 13/6683 |
| 2021/0167559 | A1 | 6/2021 | Mattei et al. |
| 2021/0336393 | A1 * | 10/2021 | Zhao ................... H01R 13/521 |

* cited by examiner

ELECTRICAL CONNECTORS WITH INTEGRAL FAULT DETECTION AND INDICATION

CROSS-REFERENCE TO RELATED APPLICATIONS

This application is a National Stage filing under § 371 of International Application No. PCT/US2022/082104, filed Dec. 21, 2022; and this application claims priority to U.S. Patent Application Ser. No. 63/297,309, filed Jan. 7, 2022, entitled "ELECTRICAL CONNECTORS WITH INTEGRAL FAULT DETECTION AND INDICATION", which are hereby incorporated herein by reference in their entirety.

BACKGROUND

The present invention relates generally to electrical connectors, such as plug-type and receptacle-type electrical connectors for AC multi-phase cables, and in particular, to electrical connectors with integral fault detection and indication.

Electrical connectors are electromechanical devices used to join electrical conductors, such as electrical cables. Cable, or in-line connectors, are permanently attached to the ends of a cable, and each can be plugged into another connector, whether a stationary connector or another in-line connector.

Electrical connectors can be configured to couple to AC multi-phase cables, and can include, for instance, three separate phase contacts, plus an Earth or ground contact, and in certain cases, a neutral contact, for a total of four or five contacts. Most three-phase power connectors have an Earth or ground connection, but may not have a neutral contact. For instance, certain large appliances, such as circular saws, air-conditioners, etc., are usually connected to a delta source of power, which has four terminals and/or contacts, that is, X, Y, and Z phase contacts, and an Earth or ground contact.

SUMMARY

Certain shortcomings of the prior art are overcome and additional advantages are provided through the provision, in one or more aspects, of an electrical connector adapted to be coupled to an AC multi-phase electrical cable. The electrical connector includes a plurality of phase contacts, a detector, and an indicator. The plurality of phase contacts include a first phase contact, a second phase contact, and a third phase contact to receive a first phase, a second phase, and a third phase, respectively, of the AC multi-phase electrical cable. The detector is configured to monitor a first temperature associated with the first phase contact, a second temperature associated with the second phase contact, and a third temperature associated with the third phase contact, where the detector is configured to detect a temperature fault at any of the first phase contact, the second phase contact, or the third phase contact. The indicator is operatively coupled to the detector and is configured to indicate the presence of the temperature fault.

In another aspect, an electrical connector is provided adapted to be coupled to an AC multi-phase electrical cable. The electrical connector includes a plurality of phase contacts, a ground contact, a detector, and an indicator. The plurality of phase contacts include a first phase contact, a second phase contact, and a third phase contact, to receive a first phase, a second phase, and a third phase, respectively, of the AC multi-phase electrical cable. The ground contact is coupled to a ground of the AC multi-phase electrical cable, and the detector is configured to monitor for a phase-ground swap fault between any one of the first phase contact, the second phase contact, or the third phase contact, and the ground contact. The indicator is operatively coupled to the detector to signal presence of the phase-ground swap fault.

In a further aspect, an electrical connector is provided adapted to be coupled to an AC multi-phase electrical cable. The electrical connector includes a plurality of phase contacts, a ground contact, a detector, and a plurality of indicators. The plurality of phase contacts include a first phase contact, a second phase contact, and a third phase contact to receive a first phase, a second phase, and a third phase, respectively, of the AC multi-phase electrical cable. The ground contact is to receive a ground of the AC multi-phase electrical cable. The detector is configured to monitor for any of a plurality of faults. The plurality of faults include a phase-ground swap fault between any one of the first phase contact, second phase contact, or third phase contact, and the ground contact, and include a temperature fault at any of the first phase contact, the second phase contact, or the third phase contact. The plurality of indicators are operatively coupled to the detector, and an indicator of the plurality of indicators signals presence of a respective fault of the plurality of faults based on the detector detecting the respective fault within the electrical connector.

Additional features and advantages are realized through the techniques described herein. Other embodiments and aspects of the invention are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
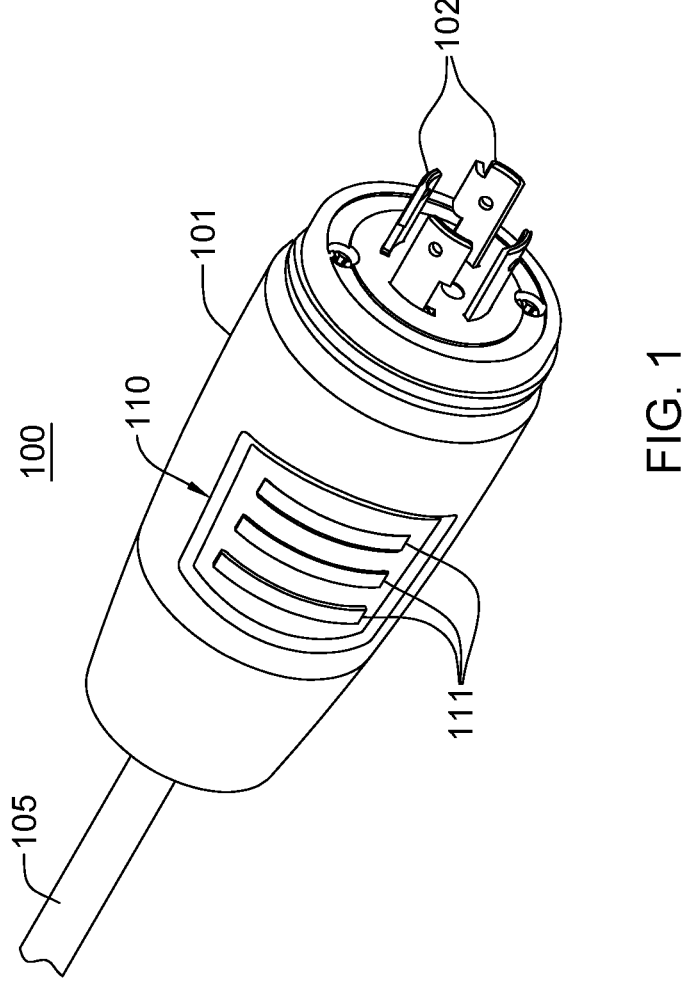
FIG. 1 depicts one embodiment of a plug-type electrical connector with integral fault detection and indication, in accordance with one or more aspects of the present invention.

The accompanying figures, in which like reference numerals refer to identical or functionally similar elements throughout the separate views, illustrate embodiments of the present invention, and together with this detailed description of the invention, serve to explain aspects of the present invention. Note in this regard that, descriptions of well-known systems, devices, components, fabrication techniques, etc., are omitted so as not to unnecessarily obscure the invention in detail. It should be understood, however, that the detailed description and the specific example(s), while indicating aspects of the invention, are given by way of illustration only, and not limitation. Various substitutions, modifications, additions, and/or other arrangements, within the spirit or scope of the underlying inventive concepts will be apparent to those skilled in the art from this disclosure. Note further that, numerous inventive aspects and features are disclosed herein, and unless inconsistent, each disclosed aspect or feature is combinable with any other disclosed aspect or feature as desired for a particular application of the concepts disclosed herein.

As known, in-line electrical connectors, or cable connectors, are configured to couple to a cable, and in the case of multi-phase cables, can include, for instance, three separate phase contacts, plus an Earth or ground contact (for a total of four contacts), and optionally a neutral contact (for a total of five contacts). Most three-phase power connectors have an Earth or ground connection, but may not have a neutral connection. For instance, certain large appliances, such as circular saws, air-conditioners, etc., are usually connected to a delta source of power, which has four terminals and/or contacts, including X, Y and Z phase contacts, and an Earth contact.

When connecting an electrical load, such as a three-phase motor to a source of electricity, it is advantageous that the user be aware of any possible fault within the electrical connector, such as an electrical fault due to improper wiring of the electrical connector to the associated AC multi-phase electrical cable. For example, a three-phase motor can run when one of the three phases is not present. However, should this happen, the current in the two remaining phase conductors can increase to the point where the motor can be damaged, and/or a dangerous overheating condition can occur. Addressing this need, disclosed herein are various electrical connectors with integral fault detection and indication features. More particularly, disclosed herein are various in-line electrical connectors, including plug-type electrical connectors and receptacle-type electrical connectors with certain novel fault detection and indication features. Note that as used herein, "electrical connectors" refers to plug-type electrical connectors, as well as receptacle-type electrical connectors.

By way of example, in one or more embodiments, an electrical connector is disclosed adapted to be coupled to an AC multi-phase electrical cable. The connector includes a plurality of phase contacts, a detector, and an indicator. The plurality of phase contacts include a first phase contact, a second phase contact, and a third phase contact to receive a first phase, a second phase, and a third phase, respectively, of the AC multi-phase electrical cable. The detector is configured to monitor for one or more faults. In one embodiment, the detector separately monitors a first temperature associated with the first phase contact, a second temperature associated with the second phase contact, and a third temperature associated with the third phase contact, to detect a temperature fault at any of the first phase contact, the second phase contact, or the third phase contact. The indicator is operatively coupled to the detector, and is configured to indicate presence of the temperature fault, that is, based on the detector detecting the temperature fault at any of the first phase contact, the second phase contact, or the third phase contact. In one embodiment, the electrical connector is an in-line electrical connector.

In one or more implementations, the detector includes multiple thermal sensors, such as multiple thermistors, multiple infra-red detectors, etc. In one implementation, the multiple thermal sensors can include multiple thermistors, including, for instance, a first thermistor, a second thermistor, and a third thermistor. The first thermistor is located to monitor the first temperature associated with the first phase contact, the second thermistor is located to monitor the second temperature associated with the second phase contact, and the third thermistor is located to monitor the third temperature associated with the third phase contact.

In one or more embodiments, the electrical connector detector and indictor can be implemented in association with one or more printed circuit boards. For instance, in one embodiment, the electrical connector can include a first circuit board accommodating the detector and multiple thermally conductive elements. The multiple thermally conductive elements include a first thermally conductive element coupling the first phase contact and the first thermistor, a second thermally conductive element coupling the second phase contact and the second thermistor, and a third thermally conductive element coupling the third phase contact and the third thermistor. In one embodiment, the first thermistor monitors a temperature of the first thermally conductive element, the second thermistor monitors a temperature of the second thermally conductive element, and the third thermistor monitors a temperature of the third thermally conductive element. In one embodiment, the connector further includes a plurality of wiring terminals, and the first thermally conductive element, second thermally conductive element, and third thermally conductive element each include a respective thermally conductive spring element, where each spring element, or clip, is in physical contact with the respective phase contact at a respective wiring terminal of the plurality of wiring terminals.

In one or more other implementations, the electrical connector can further include the first circuit board and a second circuit board. The first circuit board includes the detector to monitor for the one or more faults, and the second circuit board includes the indicator. In one embodiment, the second circuit board is coupled to the first circuit board, with the detector and the indicator being operatively connected.

In one or more embodiments, the electrical connector can include a circuit board carrier, where the second circuit board is coupled to the circuit board carrier, which facilitates maintaining the second circuit board in fixed position relative to the first circuit board. Further, in one or more embodiments, the electrical connector includes a third circuit board and a plurality of indicators, where the second and third circuit boards each include one or more indicators of the plurality of indicators. For instance, in an embodiment with two circuit boards, the second and third circuit boards are on opposite sides of the electrical connector. Where the indicators are light-indicators, this placement facilitates the associated indication arrays of the electrical connector being viewable from different angles. In one embodiment, where the plurality of indicators include a plurality of light-indicators, each second and third circuit board can include at least one indicator coupled to signal the temperature fault when detected by the detector in association with any of the first phase contact, the second phase contact, or the third phase contact. Further, in one embodiment, each second and third circuit board can drive respective light-indicators in two or more different indication arrays equally spaced about the periphery of the electrical connector to be viewable by a user of the connector from a variety of angles.

In one implementation, the detector of the electrical connector is configured to monitor for multiple types of faults, where the temperature fault is one type of fault of the multiple fault types. In one embodiment, the detector is configured to further monitor for a phase fault at any of the first phase contact, the second phase contact, or the third phase contact, as well as a ground fault at a ground contact of the electrical connector.

In one or more other implementations, an electrical connector is disclosed herein adapted to be coupled to an AC multi-phase electrical cable. The connector includes a plurality of phase contacts, a ground contact, a detector, and an indicator. The phase contacts include a first phase contact, a second phase contact, and a third phase contact to receive a first phase, a second phase, and a third phase, respectively, of the AC multi-phase electrical cable, and the ground contact is to receive a ground of the AC multi-phase electrical cable. The detector is configured to monitor for one or more faults, where the detector monitors for a phase-ground swap fault between any one of the first phase contact, the second phase contact, or the third phase contact, and the ground contact. The indicator is operatively coupled to the detector to signal presence of the phase-ground swap fault (based on the detector detecting the phase-ground swap fault within the electrical connector).

In one or more further implementations, an electrical connector is presented adapted to be coupled to an AC multi-phase electrical cable. The connector includes a plurality of phase contacts, a ground contact, a detector, and a plurality of indicators. The plurality of phase contacts include a first phase contact, a second phase contact, and a third phase contact, to receive a first phase, a second phase, and a third phase, respectively, of the AC multi-phase electrical cable, and the ground contact is to receive a ground of the AC multi-phase electrical cable. The detector is configured to monitor for any of a plurality of faults, where the plurality of faults include a phase-ground swap fault between any of the first phase contact, the second phase contact, or the third phase contact, and the ground contact, and include a temperature fault at any one of the first phase contact, the second phase contact, or the third phase contact. The plurality of indicators are operatively coupled to the detector such that an indicator of the plurality of indicators signals presence of a respective fault of the plurality of faults being monitored by the detector based on the detector detecting the respective fault within the electrical connector.

In one or more embodiments disclosed herein, the fault detectors and indicators, or indicator devices, are located within the volumetric constraints of the in-line electrical connectors for AC multi-phase electrical cables. A detector such as disclosed herein can be configured to detect any of a variety of faults, including wiring faults, and/or operational faults. For instance, detected faults can include a phase open/loss fault, a ground open/loss fault, a phase-ground swap fault, a temperature fault at any of the connector contacts, a liquid and/or humidity fault, etc.

Depending on the implementation, the indicator, or indicator device, can operate with any variation of poles or wire-grounding and non-grounding circuits of various voltages. As described herein, in one or more implementations, the indicators can include one or more light-indicators and/or one or more audible-indicators, etc., to indicate when the detector has detected any of one or more faults which the detector is configured to monitor. In an embodiment where light-indicator device(s) are provided, the light-indicator device(s) can each include one or more light sources, such as one or more lamps. In one embodiment, each lamp can be a light-emitting diode (LED), a neon bulb, or any other illuminating light device. In one or more implementations, with three-phase circuits, multiple indicators, such as, for instance, multiple light sources, can be used to indicate transition of the electrical connector from, for example, detecting absence of a fault to signaling presence of a fault, such as might be the case where temperature associated with one of the phase contacts rises over time. In one example, three light-emitting diodes can be used to signal, for instance, transition of a connector from detecting absence of a fault to presence of a fault, for instance, by changing color from green to yellow to red. In one or more other embodiments, the multiple light sources can be used to indicate, for instance, which contact and/or terminal of an electrical connector is detected by the detector to have a fault. Further, in one or more embodiments, the light-indicators can indicate the absence of a monitored fault and/or the presence of a monitored fault. For instance, where the detector is configured to monitor for a phase-loss, the absence of any phase-loss can be relayed by one or more light-indicator devices emitting a first color, such as green, and the detection of a phase-loss or fault can be relayed by switching a same, or different, one or more light-indicator devices to indicate a second color, such as a red. In one or more other embodiments, one or more bi-color or multi-color light-indicator devices, such as one or more bi-color LEDs or multi-color LEDs, can be used to indicate the absence and/or the presence of a monitored fault.

In place of, or in addition to one or more analog circuit detectors, a digital control and a communications protocol can be included within the electrical connector to provide additional functionality, such as remote-monitoring, control, setup, threshold limits, feedback, data logger, day/time stamp, etc. In one embodiment, a control to facilitate these functions can reside on computing resources, such as a micro-controller, contained within the electrical connector, and have either multiple function capability, a specific function capability, or part of a function capability. In one or more implementations, one or more fault indications can be presented local at the electrical connector(s), brought through a system to a central location, forwarded to another device, or sent to a remote site. In addition, in one or more embodiments, one or more functions can be turned ON, OFF, changed or modified either locally, remotely, or both.

By way of example, FIG. 1 depicts one embodiment of a plug-type electrical connector 100, in accordance with one or more aspects of the present invention. Electrical connector 100 is, for instance, adapted to be permanently coupled to an AC multi-phase electrical cable 105 (such as a 3-phase electrical line with a ground wire). As illustrated, electrical connector 100 includes a connector body 101 with multiple plug-type contacts 102 extending therefrom. In one or more embodiments disclosed herein, electrical connector 100 also includes a detector and one or more indicators, or indicator devices, to provide fault detection and indication integral to the electrical connector. For instance, in one embodiment, multiple identical light-based indication arrays 110 are provided at the periphery of connector body 101. In the depicted embodiment, indication array(s) 110 illuminate from light-source-based indicators which direct light to one of multiple lenses 111 at the periphery of the connector body. In one embodiment, lenses 111 can be the same or different types of lenses, whether clear or colored, as well as, in one or more embodiments, include respective light-pipes to guide light from a respective indicator within the electrical connector to indication array(s) 110 for viewing by a user. Either separately, or in combination with the light sources, a sound-generating assembly can be provided to alternatively audibly alert the user to, for instance, detection of one or more fault conditions with the electrical connector.

Figure 2:
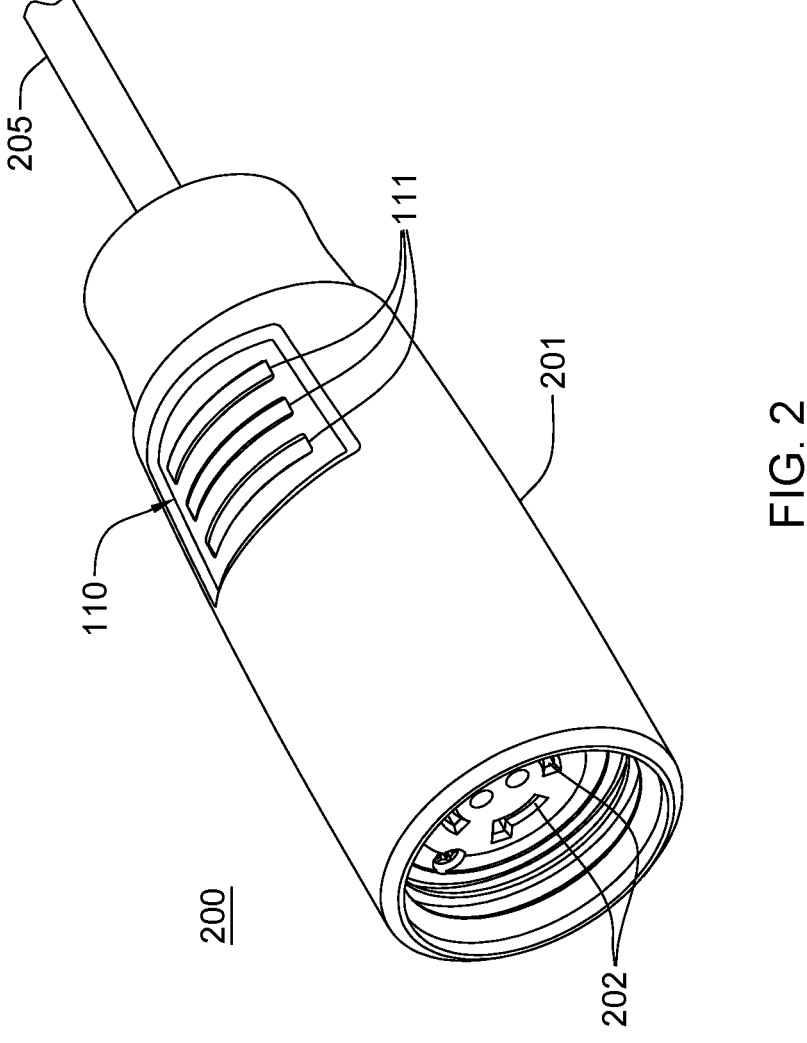
FIG. 2 depicts one embodiment of a receptacle-type electrical connector with integral fault detection and indication, in accordance with one or more aspects of the present invention.

FIG. 2 depicts one embodiment of a receptacle-type electrical connector 200, in accordance with one or more aspects of the present invention. Electrical connector 200 is, for instance, similarly constructed as electrical connector 100 of FIG. 1, and is adapted to be permanently coupled to a respective AC multi-phase electrical cable 205, which can be a different end of electrical cable 105, or a different electrical cable. As illustrated, electrical connector 200 of FIG. 2 includes a connector body 201 with multiple receptable-type contacts 202 configured to receive respective plug-type contacts, such as plug-type contacts 102 of electrical connector 101 of FIG. 1. As with electrical connector 100 of FIG. 1, electrical connector 200 of FIG. 2 is an AC multi-phase electrical connector which includes a detector and one or more indicators that provide integral fault detection and indication within the connector. For instance, in one or more implementations, electrical connector 200 of FIG. 2 includes multiple identical light-based indication arrays 110 with multiple different lenses 111, similarly constructed and configured, in one embodiment, as indication array(s) 110 in electrical connector 100 of FIG. 1.

Figure 3:
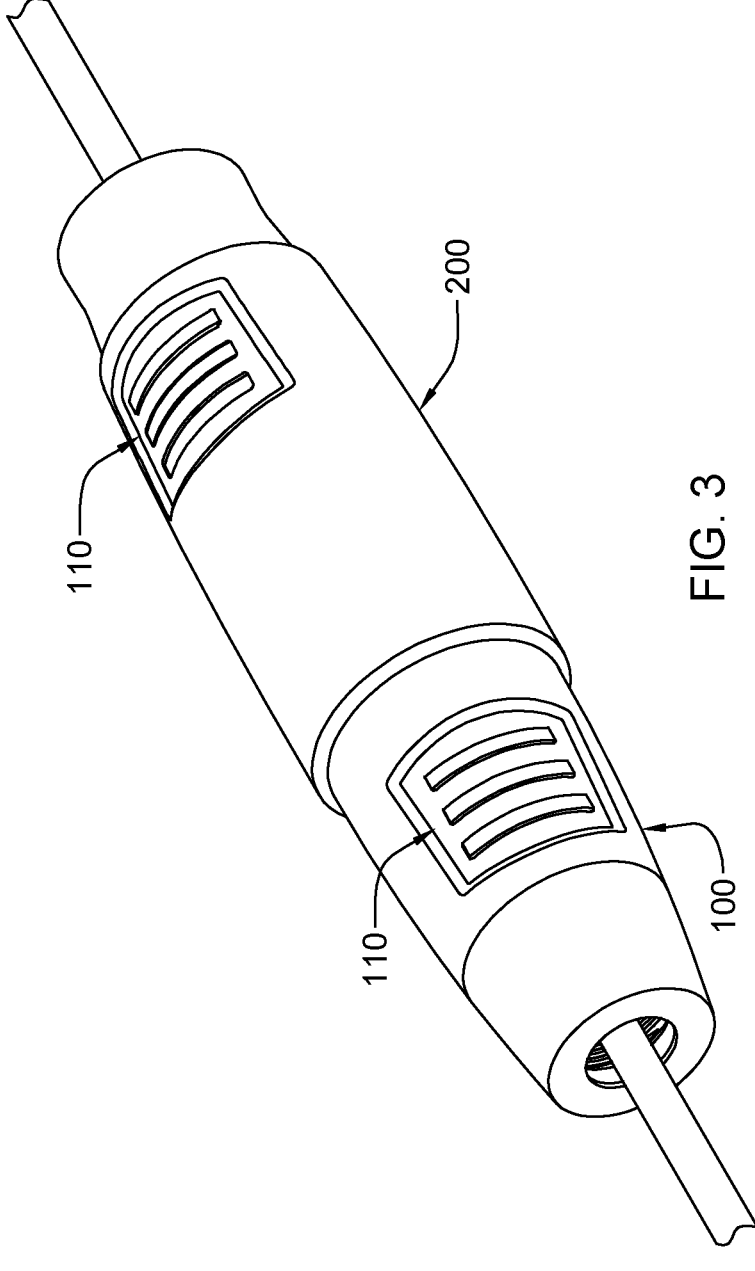
FIG. 3 depicts one embodiment of the electrical connectors with integral fault detection and indication of FIGS. 1 & 2 electrically plugged together, in accordance with one or more aspects of the present invention.

In one or more embodiments, each electrical connector 100, 200 (FIGS. 1 & 2) includes multiple substantially identical indication arrays 110. For instance, in an implementation with two indication arrays 110, the indication arrays can be similar arrays and be substantially equally spaced apart about the periphery of the connector to appear on opposite sides of the electrical connector, and thereby enhance the ability of the user to view at least one of the indication arrays when viewing the connector from a variety of angles. Further, as illustrated in FIG. 3, indication arrays 110 can be disposed within electrical connectors 100, 200 so that when the connectors are electrically plugged together, the indication arrays of the different connectors misalign to provide further opportunity for a user to be able to view at least one indication array of at least one of the electrical connectors. In one or more implementations, the location of indication arrays 110 about the periphery of an electrical connector can correlate to the location of multiple circuit boards, and in particular, the location of light sources on the circuit boards within the electrical connector, as explained further below with reference to FIGS. 4A-5.

Advantageously, in one or more aspects, disclosed herein are electrical connectors with integral fault detection and indication features that allow the electrical connectors to, for instance, inform a user as to the absence or presence of a particular type of fault in a multi-phase power supply system, such as a three-phase power supply system. In one or more embodiments, a detector is provided implemented as an analog circuit. In one or more other embodiments, the detector can be implemented as part of a digital micro-controller. The detector monitors for one or more types of faults. In one or more implementations, the detector monitors for multiple different types of faults, including, for instance, a temperature fault associated with a first phase contact, a temperature fault associated with a second phase contact, and/or a temperature fault associated with a third phase contact. For instance, in one embodiment, the temperature fault can be a temperature rise associated with one of the contacts above a programmed setpoint. In one or more further embodiments, the monitored faults can include a phase-loss or phase-open fault, a ground-loss or ground-open fault, and/or a phase-ground swap fault between any one of the first phase contact, second phase contact, or third phase contact, and the ground contact, a liquid and/or humidity fault at the connector, etc. Further, as noted, one or more indicators provide, for instance, a signal indicating the absence and/or the presence of a particular fault within the electrical connector. Fault indications are particularly advantageous as they improve safety, efficiency, and productivity of the equipment using the connectors, and also facilitate preventive and predictive maintenance. In one or more embodiments, with light-indicator devices being incorporated, indication arrays can be positioned on, or about, the connector body or housing such that they are visible to the end-user when viewed from multiple angles. In one embodiment, each electrical connector includes multiple indication arrays, with each array being similarly implemented so that a detected fault is signaled in each of the indication arrays disposed about the electrical connector. In one embodiment, the multiple indication arrays can be equally spaced about the electrical connector. Two indicator arrays per electrical connector are illustrated herein by way of example only. In one or more other embodiments, three or more similar, or identical, indicator arrays can be provided.

Advantageously, the electrical connectors with integral fault detection and indication disclosed herein improve safety, efficiency and productivity of equipment by continually monitoring and indicating the electrical condition of the connector. The high cost of unplanned down time is well documented, and has driven certain manufacturers to shift from reactive and/or schedule-based maintenance programs to condition-based programs. This shift requires the ability to assess the actual condition of equipment, including the actual condition of the electrical connectors. Further, electrical connectors with integral fault detection and indication such as disclosed herein facilitate electrical safety and workplace compliance, with focus on detecting improper wiring and/or improper operational conditions. OSHA allows the use of Assured Equipment Grounding Conductor Program (AEGCP) in place of GFCIs for ground fault protection on job sites. A similar program can be implemented in factories during maintenance activities. Compliance with the standard requires continuity and terminal connection tests on all cable or cord sets and connectors that are not part of the building's or structure's permanent wiring, including requiring that cable-connected equipment be grounded.

Figure 4A:
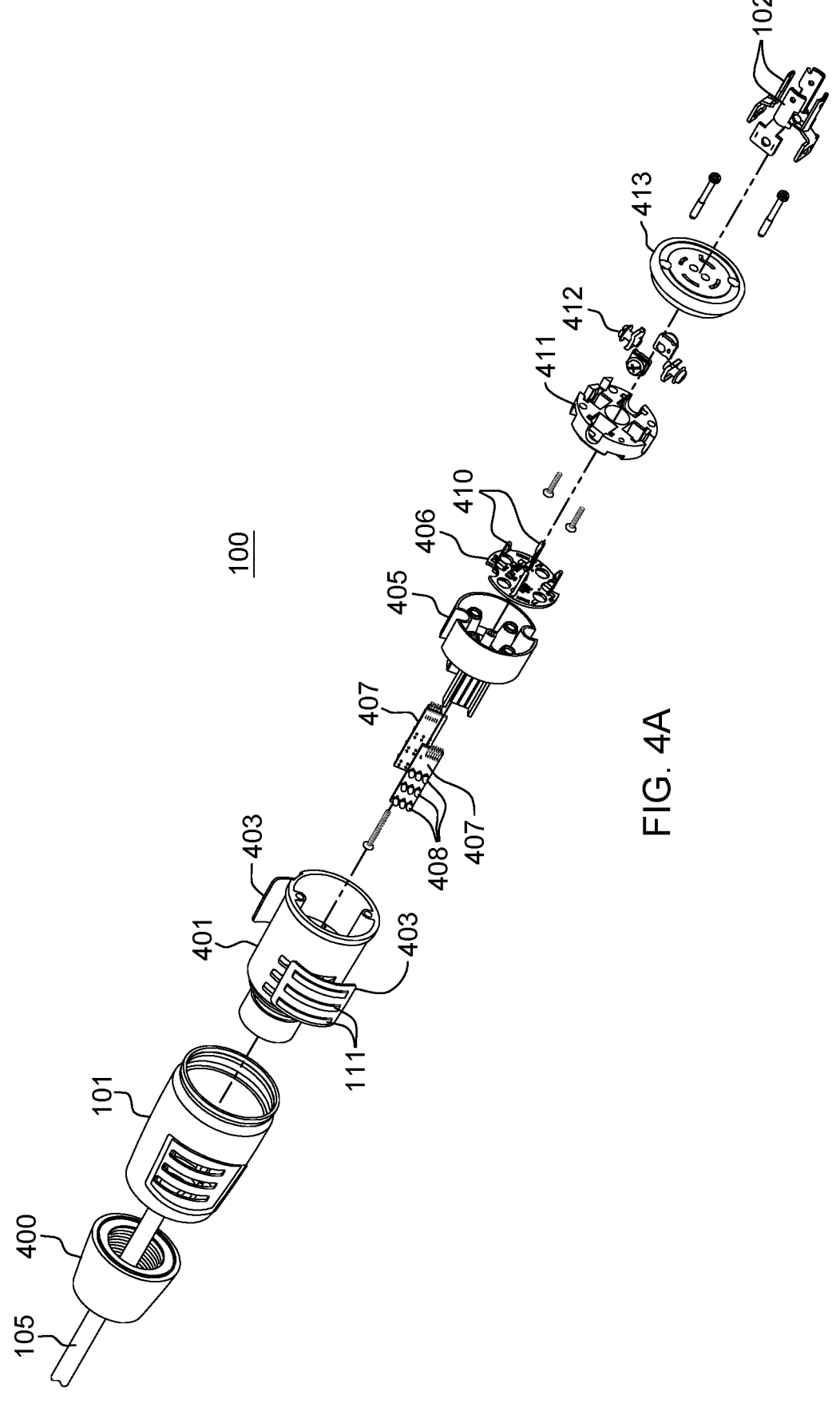
FIG. 4A is a partially-exploded view of one embodiment of the plug-type electrical connector of FIG. 1, in accordance with one or more aspects of the present invention.

By way of further example, FIG. 4A is an exploded view of one embodiment of plug-type electrical connector 100 of FIG. 1, and FIGS. 4B-4E are further detailed views of certain electrical connector 100 components and subassemblies.

Referring to FIG. 4A, in one embodiment, electrical connector 100 is adapted to be coupled to AC multi-phase electrical cable 105, and includes a cable clamp 400, which assembles to a body 101 (such as an elastic over-mold) that accommodates a connector housing 401. Connector housing 401, in the depicted embodiment, includes array elements 403 with light lenses 111, such as LED lens. As shown, a circuit board carrier 405 accommodates or receives a first circuit board 406, which in one embodiment, is a high-voltage printed circuit board. Circuit board carrier 405 further receives multiple similar second and third circuit boards 407. In one implementation, circuit boards 407 can be substantially identical circuit boards disposed on opposite sides of circuit board carrier 405. As illustrated, circuit boards 407 include, in one embodiment, rows of light sources, such as rows of LEDs 408. When assembled, the rows of LEDs provide light to the respective indicator lenses 111 via channels formed in housing 401 and body 101 and/or via respective light-pipes (not shown) directing light from the light sources to the respective lenses.

Figures 4B, 4C, 4D:
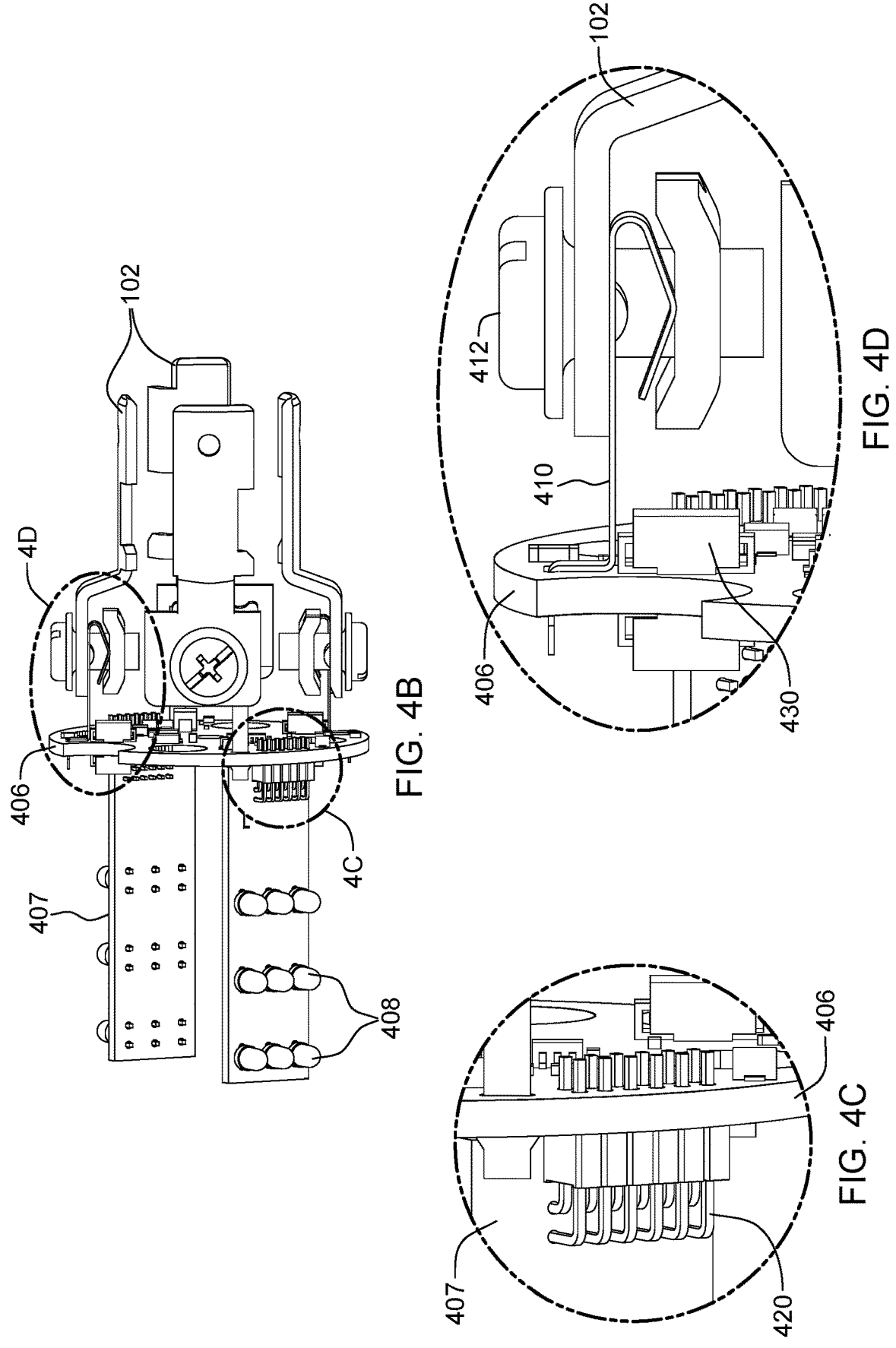
FIG. 4B illustrates the circuit board subassembly of the electrical connector of FIG. 4A, in accordance with one or more aspects of the present invention.
FIG. 4C is a partially-enlarged depiction of the subassembly of FIG. 4B, taken along line 4C thereof, in accordance with one or more aspects of the present invention.
FIG. 4D is a partially-enlarged depiction of the subassembly of FIG. 4B, taken along line 4D thereof, in accordance with one or more aspects of the present invention.

In one or more embodiments, multiple thermally conductive elements 410 extend from circuit board 406, and are sized and configured to thermally connect to respective contacts 102 of the electrical connector when assembled. For instance, as illustrated in FIGS. 4B & 4D, the thermally conductive elements 410 are each in thermal communication with a respective phase contact 102, where the contact electrically couples to a respective terminal clamp 412. In one embodiment, thermally conductive elements 410 extend through a contact and clamp assembly housing 411, and the electrical connector is sealed at the contact end by a connector face seal 413.

As noted, FIGS. 4B-4E depict further details of electrical connector 100 of FIG. 4A. In FIGS. 4B-4C, circuit boards 407 are shown operatively positioned and electrically coupled to circuit board 406 via wire connections 420. In this manner, the detector on circuit board 406 operatively drives the indicator devices on circuit boards 407. Note that in one or more implementations, the detector can reside fully on circuit board 406, or partially on circuit board 406, for instance, between circuit board 406 and circuit boards 407, if desired. In one or more implementations described herein, one or more aspects of the detector can alternatively reside remote from the electrical connector.

As illustrated in FIGS. 4B & 4D, in one embodiment, the multiple thermally conductive elements 410 are multiple thermally conductive spring elements or clips, where each thermally conductive spring element is in physical contact with a respective phase contact 102. In the embodiment illustrated, each thermally conductive element 410 resides between the respective contact 102 and a terminal clamp 412, and thermally conducts heat back to circuit board 406. In one or more implementations, circuit board 406 includes multiple thermistors 430, which can include a first thermistor, a second thermistor, and a third thermistor disposed on circuit board 406 in physical contact with, or close proximity to, a respective thermally conductive element 410 of the multiple thermally conductive elements. In one implementation, thermistors 430 are located on an opposite side of the circuit board 406 from the side accommodating circuit boards 407. In operation, thermally conductive elements 410 thermally couple each contact, such as each phase contact, to a respective thermistor 430 to allow monitoring of a temperature associated with the phase contact. In this manner, a temperature associated with a first phase contact, a temperature associated with a second phase contact, and a temperature associated with a third phase contact, are monitored by the detector in a three-phase electrical connector configuration. Note in this regard that the temperature sensed by the thermistors can be correlated or corrected to a contact temperature for comparison to a specified over-temperature threshold through, for instance, pre-calibration of the thermistors and detector.

Figure 4E:
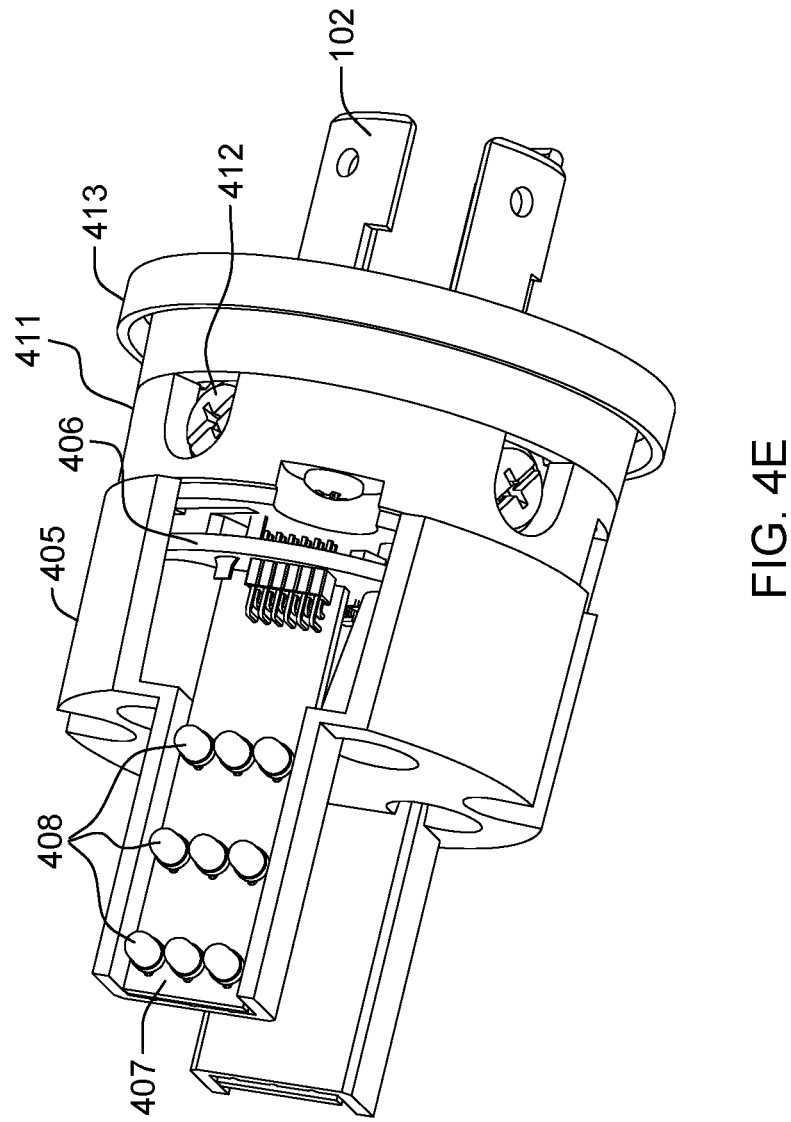
FIG. 4E is a further partial subassembly of the electrical connector of FIG. 4A, depicting one embodiment of a circuit board carrier thereof, in accordance with one or more aspects of the present invention.

FIG. 4E is a further partial subassembly of electrical connector 100 of FIGS. 4A-4D. In this subassembly depiction, circuit board carrier 405 is shown in operative position holding in fixed position circuit board 406 and circuit boards 407, with the multiple rows of LEDs 408 illustrated. Further, contacts 102 are shown extending out from connector face seal 413 and contact and clamp assembly housing 411, with terminal clamps or screws 412 shown accessible through contact and clamp assembly housing 411. Note that in one or more embodiments, each row of LEDs 408 is operatively connected to the detector to signal presence and/or absence of a particular fault being monitored by the detector. For instance, in one embodiment, a first row of LEDs 408 signals the presence or absence of a phase fault, a second row signals the presence or absence of a temperature fault, and a third row signals the presence or absence of a ground fault. Note that three rows of LEDs 408 are illustrated by way of example only, and that in one or more other implementations, less or more rows of LEDs 408 can be provided. As described herein, in one or more implementations, each row of LEDs signals both the absence of a fault, or the presence of a fault, and in certain embodiments, the transition from one to the other. For instance, in one implementation, a row of LEDs 408 can provide a green signal to signify absence of the associated fault, and a red signal to signify presence of the associated fault, with transition from absence to presence potentially being a third color, such as yellow. The third color can be provided in a number of manners, including, providing three distinct-color LEDs, or providing appropriate drive signal levels to both the green and red LEDs in order to provide, for instance, the appearance of a yellow signal when transitioning between the first and second colors.

Figure 5:
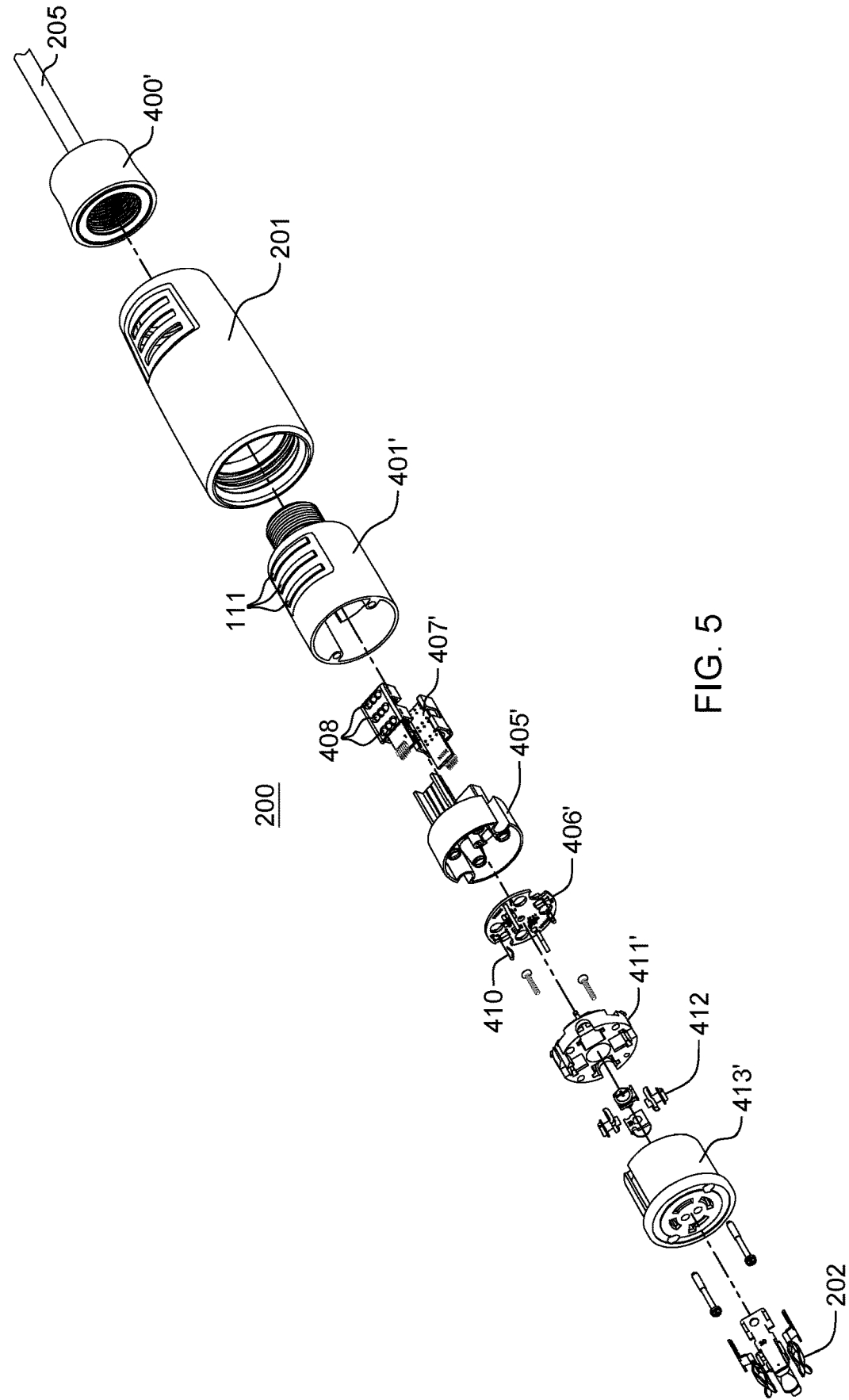
FIG. 5 is a partially-exploded view of one embodiment of the receptacle-type electrical connector of FIG. 2, in accordance with one or more aspects of the present invention.

FIG. 5 depicts an exploded view of one embodiment of electrical connector 200 coupled to AC multi-phase electric cable 205, such as described above in connection with FIG. 2. As illustrated, electrical connector 200 is similar to electrical connector 100 of FIGS. 4A-4E, with a principal exception being that electrical connector 200 in FIG. 5 is a receptacle-type connector, with differently figured contacts 202. In particular, electrical connector includes a cable clamp 400', which assembles to a housing 401' that can optionally have an elastic over-mold or body 201. Connector housing 401', in the depicted embodiment, includes an indication array with light lenses 111, such as LED lenses. As shown, a circuit board carrier 405' accommodates a circuit board 406', which in one embodiment, is a high-voltage printed circuit board. Circuit board carrier 405' further receives multiple circuit boards 407', which in one embodiment, are substantially identical circuit boards disposed on opposite sides of circuit board carrier 405'. As illustrated, circuit boards 407' include, for instance, rows of light sources, such as rows of LEDs 408. When assembled, the rows of LEDs provide light to the respective indicator lenses 111 via channels formed in housing 401' and body 201 and/or via respective light pipes directing light from the light sources to the respective lenses.

In one embodiment, multiple thermally conductive elements 410 extend from circuit board 406', which are sized and configured to thermally couple to respective contacts 202 of the electrical connector when assembled. For instance, in one embodiment, thermally conductive elements 410 are each in thermal communication with a respective phase contact 202, where the contacts electrically couple to respective terminal clamps 412. As illustrated, in one embodiment, thermally conductive elements 410 extend through a contact and clamp assembly housing 411', and the electrical connector is sealed at the contact end by an appropriately configured connector face seal 413'.

Figure 6A:
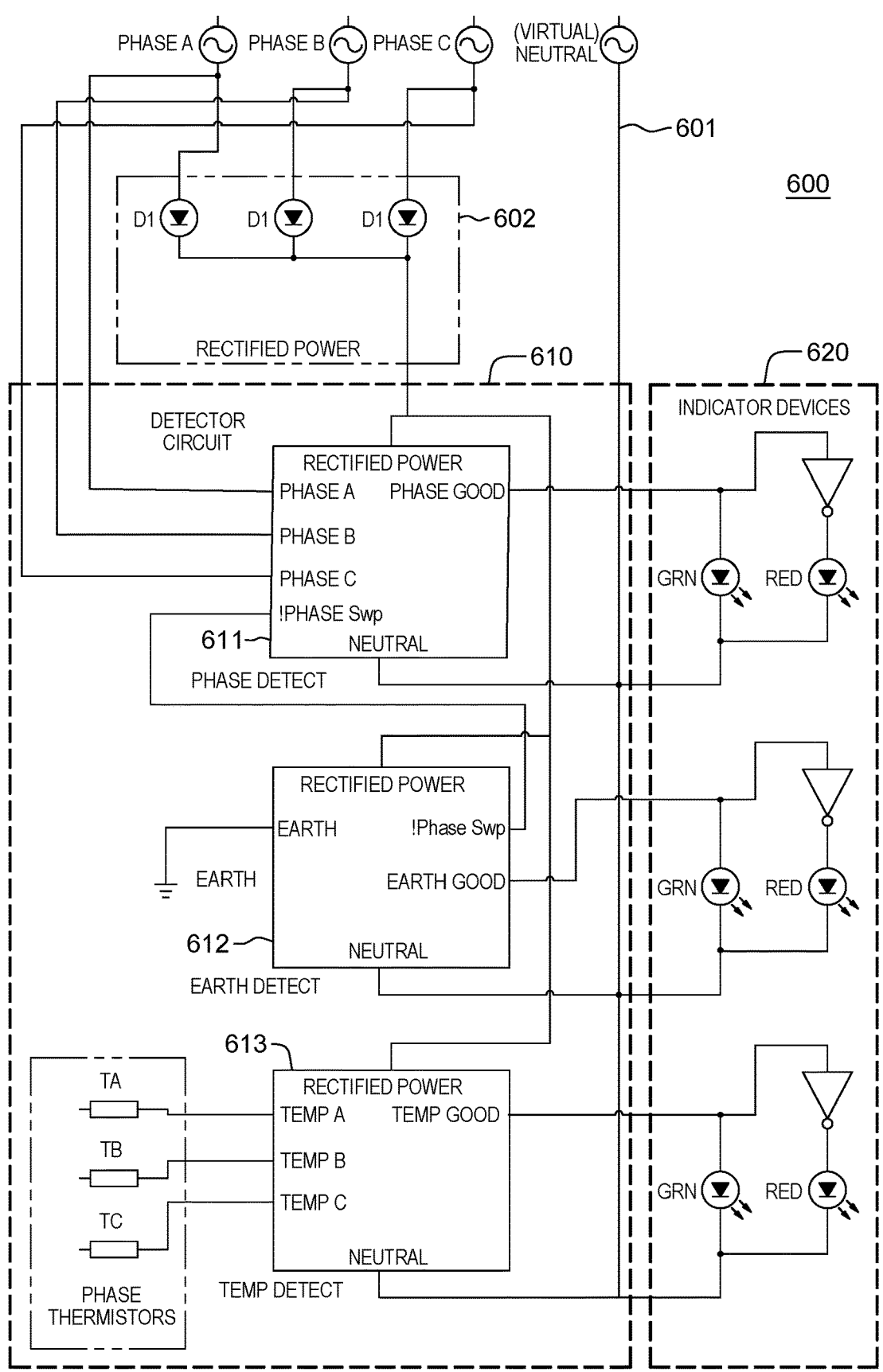
FIG. 6A is a circuit diagram illustrating one embodiment of the fault detector and indicator devices of an electrical connector, in accordance with one or more aspects of the present invention.

By way of further example, FIG. 6A is a circuit 600 diagram illustrating one embodiment of a fault detector and indicators, or indicator devices, of an electrical connector (in accordance with one or more aspects disclosed herein) adapted to be coupled to a 3-phase AC electrical cable, with a total of 4 wires. As illustrated, the 4 wires include a phase A wire, a phase B wire, and a phase C wire, as well as a ground or Earth wire. In this 4-wire cable embodiment, the concept of a virtual neutral 601 is introduced. In one embodiment, virtual neutral 601 is obtained by using three 3 equal resistors coupled as a WYE load, with the node shared by all three resistors being the virtual neutral. A power rectifier circuit 602 provides DC power to a detector circuit 610 which drives indicator devices 620.

In the illustrated embodiment, detector circuit 610 includes a phase-detect circuit 611, an Earth-detect circuit 612, and a temperature-detect circuit 613, with each detect circuit 611-613 driving one or more corresponding light-indicator devices of indicator devices 620. In the embodiment illustrated, each set of indicator devices includes at least one green light source and at least one red light source, such as a green LED and a red LED. As illustrated, the 3-phase signals are fed to phase-detect circuit 611, along with an "Earth phase not swapped" (!phase swp) as inputs. In one embodiment, the four inputs are fed to a 4-input logic AND gate. Note that the A, B and C phase inputs can be obtained by attenuating, rectifying, and filtering the corresponding phase signals. The phase A signal, phase B signal and phase C signal are logic 'high' when present, and logic 'low' when absent. When the phases are present, and a phase-ground swap fault is not detected, then, in one embodiment, the corresponding green light-indicator is illuminated. Otherwise, the red light-indicator is illuminated to signal a phase fault.

Earth-detect circuit 612 includes a 2-input logic AND gate with the Earth or ground signal being one input, and the "Earth phase not swapped" (!phase swp) being the other. The Earth or ground signal is logic 'high' when there is a current path from the ground pin to either a phase or to Earth. 'Earth' is logic 'low' otherwise. The 'Earth phase not swapped' signal is logic 'high' when the ground pin is correctly wired to Earth, or when the ground pin is left unconnected (floating). The 'Earth phase not swapped' is logic 'low' otherwise. Note that in one embodiment, the 'Earth phase not swapped' sub-circuit uses the RMS voltage between the virtual neutral 601 and Earth to detect if a phase is improperly connected to the ground pin. The 'Earth phase not swapped' signal is logic 'low' when the Earth is swapped with one of the phase lines.

The temperature-detect circuit 613, or over-temperature circuit, includes (in one embodiment) a 3-input logic OR gate, with phase A, B and C temperature signals being received as inputs. The over-temperature signal is logic 'high' when an over-temperature event occurs (i.e., with a contact exceeding a set temperature threshold), and logic 'low' otherwise. As with the phase-detect circuit, the Earth-detect circuit and temperature-detect circuits drive a respective set of indicator devices, such as a green light-indicator, which is illuminated when the corresponding fault is not detected, and one or more red light-indicators, which are when the corresponding fault is detected.

Figure 6B:
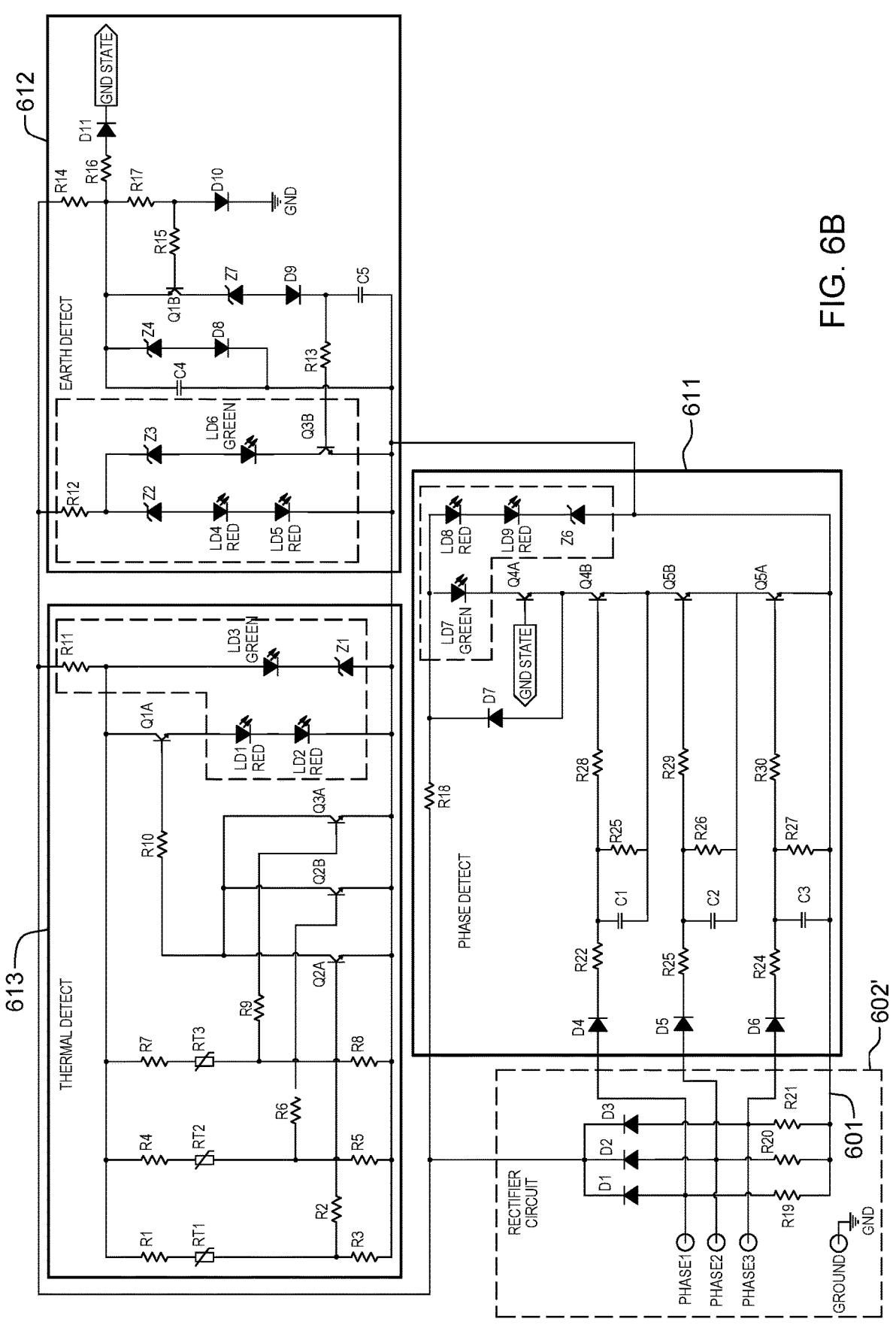
FIG. 6B is a schematic illustrating one detailed embodiment of the circuit of FIG. 6A, in accordance with one or more aspects of the present invention.

FIG. 6B depicts a detailed schematic embodiment of the circuit diagram of FIG. 6A. In the embodiment illustrated, rectifier circuit 602' includes three equal resistors R19-R21, connected as a WYE load to provide virtual neutral signal 601, which is fed to phase-detect circuit 611, Earth-detect circuit 612, and temperature-detect circuit 613. As illustrated, the three phases, phase 1, phase 2, phase 3 (i.e., phase A, phase B and phase C in FIG. 6A) are rectified via corresponding circuitry D4-D6, C1-C3 & R22-R30, to drive corresponding transistors Q4B, Q5B & Q5A, coupled between a rectified DC voltage and the virtual neutral. Additionally, the Earth-detect state, or ground state, drives a series-connected transistor Q4A, and when all transistors are conducting, green LED7 is energized. Should any phase be lost or a fault occur, then the corresponding transistors transitions OFF, turning off the green LED and activating one or more red LEDs, RD8-RD9. Multiple Zener diodes Z1-Z7 can be provided throughout the circuitry to account for voltage drop where needed.

In one embodiment, the Earth-detect state (or ground state) signal arises from Earth-detect circuit 612, and drives transistor Q4A of phase-detect circuit 611. In Earth-detect circuit 612, transistor Q1B conducts when the ground contact is properly connected. (When a phase signal and ground signal are swapped, then transistor Q4A of phase-detect circuit 611 is OFF.) When transistor Q1B is ON, transistor Q3B is ON, driving the green LED (LED6 in this example), and when transistor Q3B is OFF, the red LED(s) (LED4 & LED5) are driven. Note that Earth-detect circuit 612 includes capacitor C4 in case there is a phase fault and swap with the ground contact. Those skilled in the art will note that the values of the various resistors R12-R17, capacitors C4, C5, and transistors Q1B, Q3B, can be selected for a particular application in order to, for instance, determine the setpoint for transitioning from the green LED-indicator(s) being ON to the red LED-indicators being ON.

Thermal detect circuit 613 is shown to include, in one embodiment, multiple thermistors RT1-RT3, with each thermistor being coupled, as described herein, to monitor temperature of an associated phase contact. Resistor values R1-R10 are chosen to achieve the desired thresholds for switching transistors Q2A, Q2B, Q3A & Q1A. Assuming that the temperature of the phase contacts is within specification, then a green LED LD3 is active, and if a fault be detected, transistor Q1A starts conducting, which transitions current to the red LEDs LD1, LD2. As explained above, during transitioning from green to red, an intermediate color can be signaled, such as yellow, to a user viewing the indication array, which informs the user that one or more of the phase contacts is starting to exceed the specified temperature threshold.

Figure 7A:
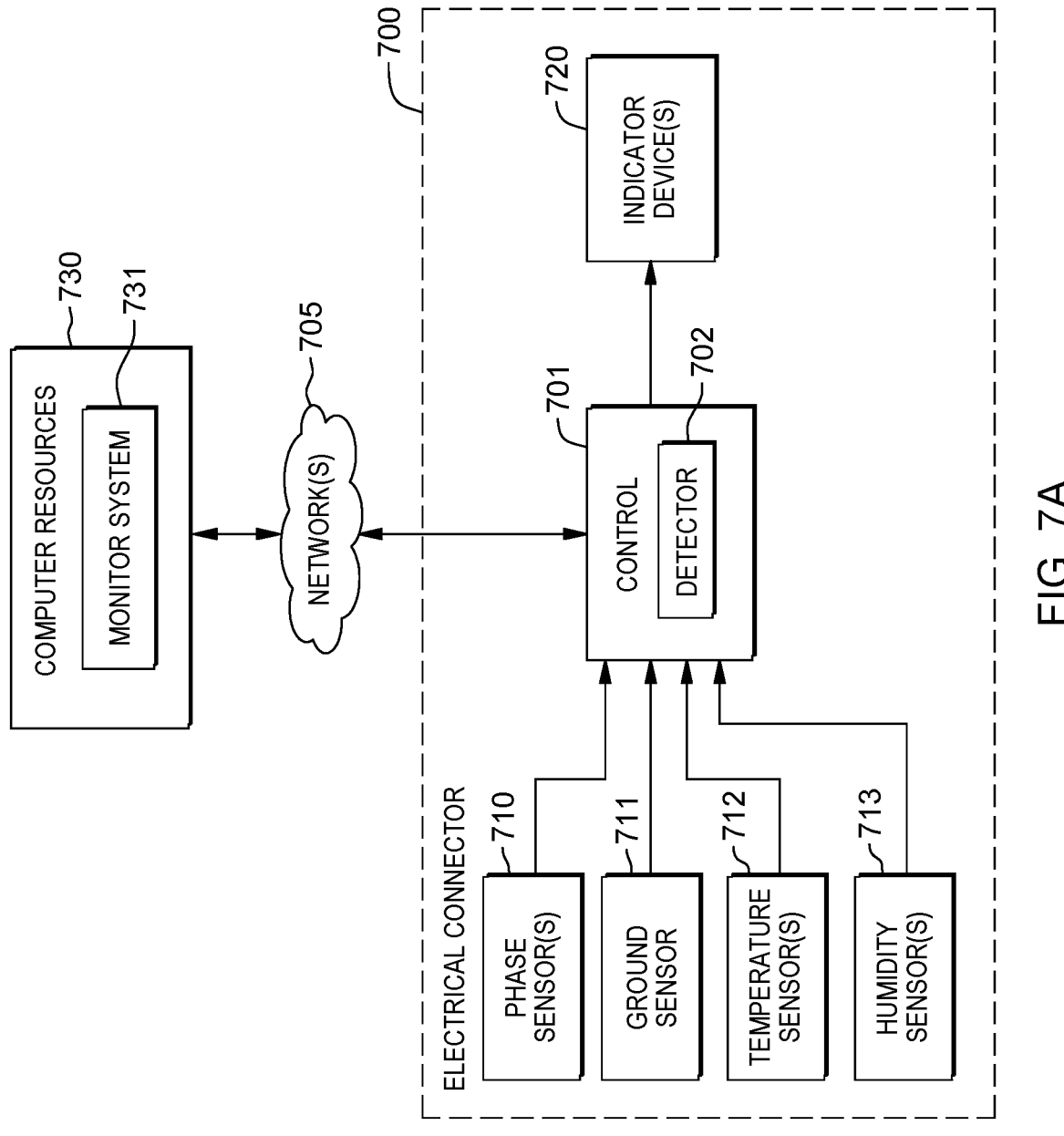
FIG. 7A depicts another embodiment of the fault detector and indicator device(s) of an electrical connector, in accordance with one or more aspects of the present invention.
Figure 7B:
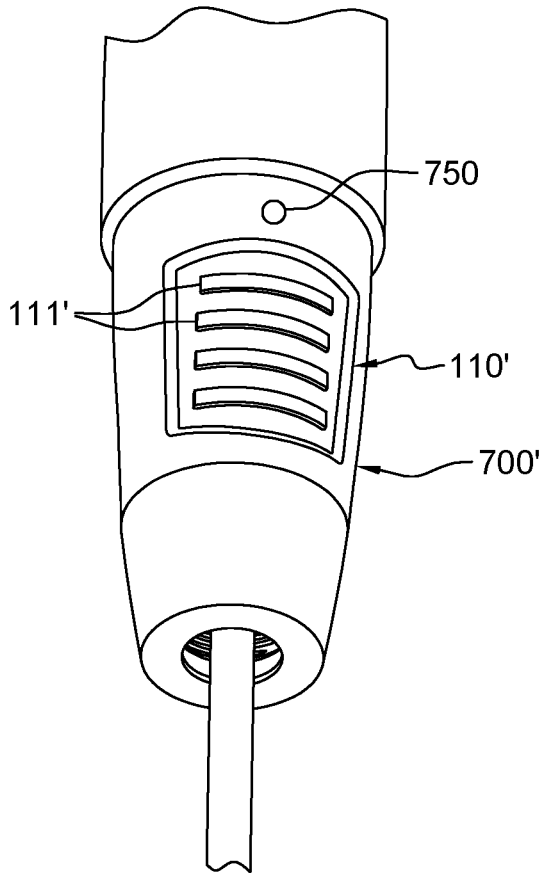
FIG. 7B depicts one embodiment of the electrical connector with integral fault detection and indication of FIG. 7A, in accordance with one or more aspects of the present invention.
Figure 8:
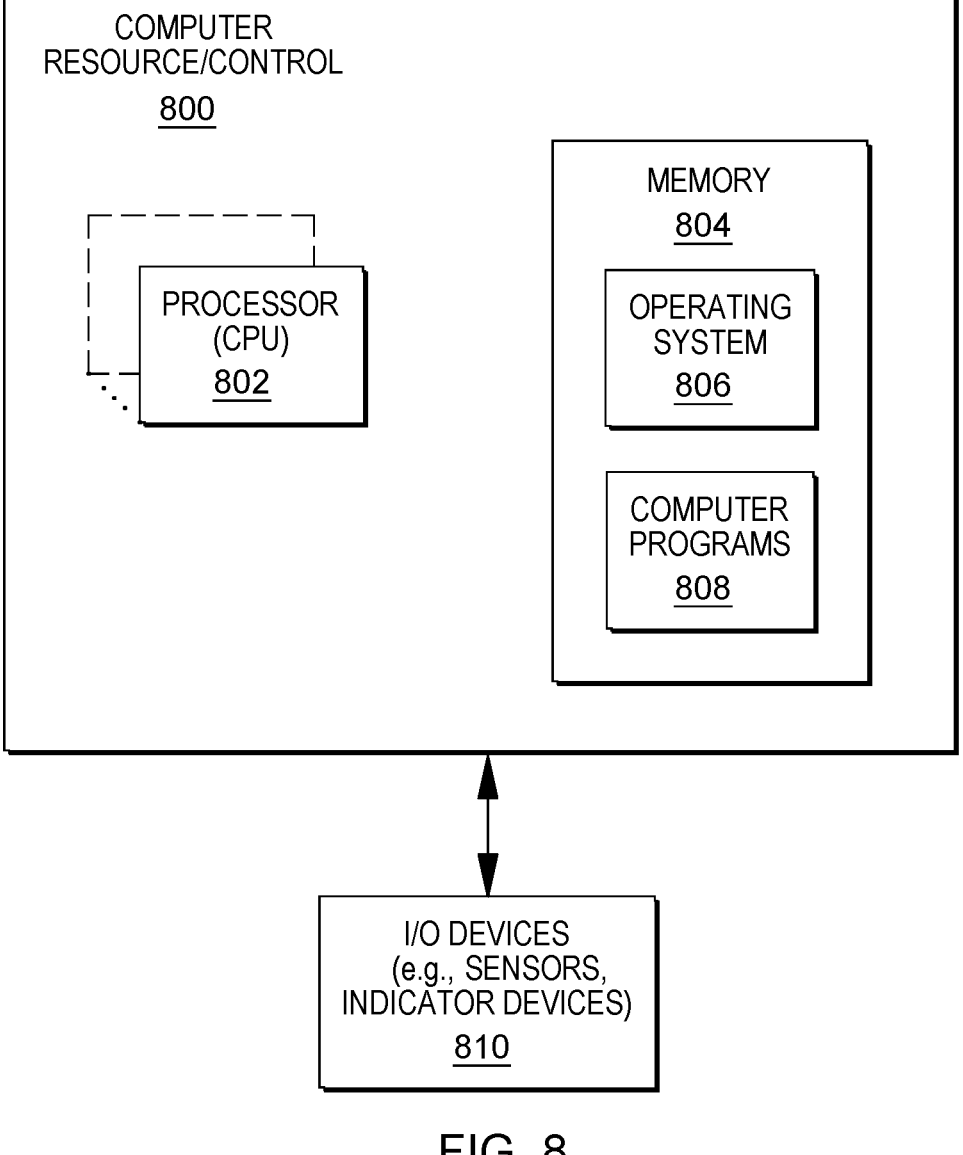
FIG. 8 is a block diagram of one embodiment of the control of FIG. 7A, in accordance with one or more aspects disclosed herein.

FIGS. 7A-8 depict alternate embodiments of an electrical connector with integral fault detection and indication, in accordance with one or more aspects of the present invention.

Referring to FIG. 7A, a further embodiment is illustrated which includes one or more electrical connectors 700, such as the electrical connectors described above in connection with FIGS. 1-5, however, with one or more detect aspects thereof being implemented as program code executing on a control 701, such as a micro-controller within the electrical connector. In this embodiment, one or more aspects of the analog implementations described above in connection with FIGS. 6A-6B can be implemented digitally by the micro-controller and associated code. In this manner, control 701 can include one or more aspects of detector 702, and drive indicator device(s) 720. As illustrated in FIG. 7A, electrical connector 700 further includes one or more sensors. In one or more embodiments, the electrical connector can include multiple sensors, such as one or more phase sensors 710 for sensing a phase-loss or fault on one of the phase contacts, a ground sensor 711 for sensing a ground-loss or fault on a ground contact, one or more temperature sensors 712 for sensing a temperature fault on one or more of the phase contacts, a liquid/humidity sensor 713 for sensing a liquid or humidity fault within the electrical connector associated with, for instance, one or more of the phase contacts or ground contact, etc. In this implementation, the control 701 provides appropriate signals to turn ON or OFF indicator devices 720, such as the multiple light-indicator devices illustrated herein.

In the embodiment of FIG. 7A, control 701 is in communication across one or more networks 705 with a monitor system 731 executing on one or more computer resources 730 remote from electrical connector 700. In one implementation, monitor system 731 can be a centrally-located monitor system within a building or other facility monitoring status of a plurality of electrical connectors within the building or facility. In another embodiment, monitor system 731 can be a cloud-based monitor system monitoring electrical connectors across a variety of locations, such as for an entity or an organization. By way of example, network(s) 705 can be a telecommunications network, a local-area network (LAN), a wide-area network (WAN), such as the Internet, or a combination thereof, and can include wired, wireless, fiber-optic connections, etc. The network(s) 705 is capable of receiving and transmitting data between, for instance, control 701 of electrical connector 700 and monitor system 731.

FIG. 7B depicts one embodiment of an electrical connector 700' similar to electrical connector 700 of FIG. 7A. In this embodiment, four rows of lenses 111' are provided in each indicator array 110' on electrical connector 700', with each lens receiving light from one or more respective light-indicator devices signaling one or more of a phase-loss or fault, a ground-loss or fault, a temperature-loss or fault, a humidity-loss or fault, a phase-ground swap fault, etc. Note that in one or more embodiments, a phase-ground swap fault can be signaled by both the phase fault indicators and ground fault indicators signaling a loss or fault simultaneously. In the embodiment of FIG. 7B, a wireless transceiver 750 is also shown included in electrical connector 700' for communicating with, for instance, a remote monitor system such as described above in connection with the embodiment of FIG. 7A.

As described herein, in one or more implementations, a control and/or a computer resource such as depicted in FIG. 7A includes a controller, circuit, computer, etc., with memory and/or storage and a processing circuit or processor, where the memory stores instructions for execution by the processing circuit to perform actions such as described herein. In this regard, the control and/or computer resource can be regarded as a computing system or environment capable of executing program instructions.

FIG. 8 depicts one example of such a computer resource/control 800 with associated I/O devices 810 to incorporate and/or use aspects described herein. The computer resource/control can be based on one or more of various system architectures and/or instruction set architectures, such as those offered by, e.g., ARM Holdings plc (Cambridge, England, United Kingdom), as an example.

Computer resource/control 800 includes one or more processor(s) 802, for instance central processing unit(s) (CPUs) and/or microprocessors. A processor can include functional components used in the execution of instructions, such as functional components to fetch program instructions from locations such as cache or main memory, decode program instructions, and execute program instructions, access memory for instruction execution, and write results of the executed instructions. A processor 802 can also include one or more registers to be used by one or more of the functional components. Computer resource/control 800 also includes memory 804, and is coupled to, or includes, input/output (I/O) devices 810, which may be coupled to processor(s) 802 and each other via one or more circuit board buses and/or other connections. Bus connections represent one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 804 can be or include main or system memory (e.g. Random Access Memory) used in the execution of program instructions, storage device(s) such as hard drive(s), flash media, or optical media as examples, and/or cache memory, as examples. Memory 804 can include, for instance, a cache, such as a shared cache, which may be coupled to local caches (examples include L1 cache, L2 cache, etc.) of processor(s) 802. Additionally, memory 804 may be or include at least one computer program product having a set (e.g., at least one) of program modules, instructions, code or the like configured to carry out functions of embodiments described herein when executed by one or more processors.

Memory 804 can store an operating system 806 and other computer programs 808, such as one or more computer programs/applications that execute to perform aspects described herein. Specifically, programs/applications can include computer readable program instructions that may be configured to carry out functions of embodiments of aspects described herein.

Examples of I/O devices 810 include but are not limited to condition sensors, such as phase sensors, ground sensors, temperature sensors, humidity sensors, etc., within the electrical connector, as well as indicators, such as light-indicator devices, audible-indicator devices, etc. An I/O device can be incorporated into the control or computer system or be regarded as an external device coupled to the control through one or more I/O interfaces.

Computer resource/control 800 may be operational with numerous general purpose or special purpose computing system environments or configurations. Computer resource/control 800 can take any of various forms, well-known examples of which include, but are not limited to, a microcontroller, multiprocessor system(s), microprocessor-based system(s), systems-on-a-chip (SOCs), electronic control systems, and the like.

Aspects of the present invention can be implemented within a control assembly, system, method, and/or computer program product, any of which may be configured to perform or facilitate functions described herein.

In some embodiments, aspects of the present invention can take the form of a computer program product, which can be embodied as computer readable medium(s). A computer readable medium may be a tangible storage device/medium having computer readable program code/instructions stored thereon. Example computer readable medium(s) include, but are not limited to, electronic, magnetic, optical, or semiconductor storage devices or systems, or any combination of the foregoing. Example embodiments of a computer readable medium include a hard drive or other mass-storage device, an electrical connection having wires, random access memory (RAM), read-only memory (ROM), erasable-programmable read-only memory such as EPROM or flash memory, an optical fiber, an optical storage device, a magnetic storage device, or any combination of the foregoing. The computer readable medium may be readable by a processor, processing unit, or the like, to obtain data (e.g. instructions) from the medium for execution. In a particular example, a computer program product is or includes one or more computer readable media that includes/stores computer readable program code to provide and facilitate one or more aspects described herein.

As noted, program instruction contained or stored in/on a computer readable medium can be obtained and executed by any of various suitable components such as a processor of a computer system to cause the computer system to behave and function in a particular manner. Such program instructions for carrying out operations to perform, achieve, or facilitate aspects described herein may be written in, or compiled from code written in, any desired programming language. In some embodiments, such programming language includes object-oriented and/or procedural programming languages such as C, C++, C#, Java, etc.

Program code can include one or more program instructions obtained for execution by one or more processors. Computer program instructions may be provided to one or more processors of, e.g., one or more computer systems, to produce a control assembly, such that the program instructions, when executed by the one or more processors, perform, achieve, or facilitate aspects of the present invention, such as actions or functions described in flowcharts and/or block diagrams described herein. Thus, each block, or combinations of blocks, of the flowchart illustrations and/or block diagrams depicted and described herein can be implemented, in some embodiments, by computer program instructions.

Although various embodiments are described above, these are only examples. For example, computing environments of other architectures can be used to incorporate and use one or more embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. An electrical connector adapted to be coupled to an AC multi-phase electrical cable, the electrical connector comprising:

a plurality of phase contacts, the plurality of phase contacts including a first phase contact, a second phase contact, and a third phase contact to receive a first phase, a second phase, and a third phase, respectively, of the AC multi-phase electrical cable;

a detector configured to monitor a first temperature associated with the first phase contact, a second temperature associated with the second phase contact, and a third temperature associated with the third phase contact, wherein the detector is configured to detect a temperature fault at any of the first phase contact, the second phase contact, or the third phase contact, wherein the detector comprises a plurality of thermistors, the plurality of thermistors including a first thermistor, a second thermistor, and a third thermistor, the first thermistor being located to monitor the first temperature associated with the first phase contact, the second thermistor being located to monitor the second temperature associated with the second phase contact, and the third thermistor being located to monitor the third temperature associated with the third phase contact;

a first thermally conductive element coupling the first phase contact and the first thermistor, a second thermally conductive element coupling the second phase contact and the second thermistor, and a third thermally conductive element coupling the third phase contact and the third thermistor, wherein the first thermistor monitors a temperature of the first thermally conductive element, the second thermistor monitors a temperature of the second thermally conductive element, and the third thermistor monitors a temperature of the third conductive element;

a plurality of wiring terminals, wherein the first thermally conductive element, second thermally conductive element and third thermally conductive element each comprise a respective thermally conductive spring element in physical contact with the respective first, second or third phase contact at a respective wiring terminal of the plurality of wiring terminals; and an indicator operatively coupled to the detector, the indicator configured to indicate the presence of the temperature fault.

2. The electrical connector of claim 1, further comprising:

a first circuit board, the first circuit board including the detector to monitor the first, second and third temperatures; and a second circuit board, the second circuit board including the indicator, wherein the second circuit board is coupled to the first circuit board, with the detector and the indicator being operatively connected.

3. The electrical connector of claim 2, further comprising a circuit board carrier, the second circuit board being coupled to the circuit board carrier, and the circuit board carrier facilitating maintaining the second circuit board in fixed position relative to the first circuit board.

4. The electrical connector of claim 3, further comprising a third circuit board and a plurality of indicators, the indicator being one indicator of the plurality of indicators, and the third circuit board including another indicator of the plurality of indicators.

5. The electrical connector of claim 4, wherein the plurality of indicators comprise a plurality of light-indicators.

6. The electrical connector of claim 1, wherein the detector is configured to monitor for a plurality of faults, the temperature fault being one fault of the plurality of faults, and wherein the detector is further configured to monitor for a phase fault at any of the first phase contact, the second phase contact, or the third phase contact, as well as a ground fault at a ground contact.

7. An electrical connector adapted to be coupled to an AC multi-phase electrical cable, the electrical connector comprising:

a plurality of phase contacts, the plurality of phase contacts including a first phase contact, a second phase contact, and a third phase contact to receive a first phase, a second phase, and a third phase, respectively, of the AC multi-phase electrical cable;

a ground contact, the ground contact to receive a ground of the AC multi-phase electrical cable;

a detector configured to monitor for a phase-ground swap fault between any one of the first phase contact, second phase contact, or third phase contact, and the ground contact;

an indicator device operatively coupled to the detector to signal presence of the phase-ground swap fault; and wherein the AC multi-phase electrical cable is a 4-wire AC multi-phase electrical cable including a first phase wire, a second phase wire, a third phase wire, and a ground wire, and wherein the detector comprises a resistance circuit electrically coupled to the first phase wire, the second phase wire, and the third phase wire, to generate a virtual neutral signal, the detector using the virtual neutral signal in monitoring for the phase-ground swap fault between any one of the first phase contact, the second phase contact, or the third phase contact, and the ground contact.

8. The electrical connector of claim 7, wherein the detector comprises an Earth-phase-swap subcircuit, the Earth-phase-swap subcircuit using a voltage between the virtual neutral signal and a signal at the ground contact in monitoring for the phase-ground swap fault.

9. The electrical connector of claim 7, further comprising:

a first circuit board, the first circuit board including the detector to monitor for the phase-ground swap fault; and a second circuit board, the second circuit board including the indicator, wherein the second circuit board is coupled to the first circuit board, with the detector and the indicator being operatively connected.

10. The electrical connector of claim 9, further comprising a circuit board carrier, the second circuit board being coupled to the circuit board carrier, and the circuit board carrier facilitating maintaining the second circuit board in fixed position relative to the first circuit board.

11. The electrical connector of claim 10, further comprising a third circuit board and a plurality of indicators, the indicator being one indicator of the plurality of indicators, and the third circuit board including another indicator of the plurality of indicators.

12. The electrical connector of claim 11, wherein the plurality of indicators comprise a plurality of light-indicators.

13. An electrical connector adapted to be coupled to an AC multi-phase electrical cable, the electrical connector comprising:

a plurality of phase contacts, the plurality of phase contacts including a first phase contact, a second phase contact, and a third phase contact to receive a first phase, a second phase, and a third phase, respectively, of the AC multi-phase electrical cable;

a ground contact, the ground contact to receive a ground of the AC multi-phase electrical cable;

a detector configured to monitor for any of a plurality of faults, the plurality of faults including a phase-ground swap fault between any one of the first phase contact, the second phase contact, or the third phase contact, and the ground contact, and a temperature fault at any of the first phase contact, the second phase contact, or the third phase contact;

a plurality of indicators operatively coupled to the detector, wherein an indicator of the plurality of indicators signals presence of a respective fault of the plurality of faults based on the detector detecting the respective fault within the electrical connector; and wherein the AC multi-phase electrical cable is a 4-wire AC multi-phase electrical cable including a first phase wire, a second phase wire, a third phase wire, and a ground wire, and wherein the detector comprises a resistance circuit electrically coupled to the first phase wire, the second phase wire, and the third phase wire, to generate a virtual neutral signal, the detector using the virtual neutral signal in monitoring for the phase-ground swap fault between any one of the first phase contact, the second phase contact, or the third phase contact, and the ground contact.

14. The electrical connector of claim 13, wherein the detector comprises an Earth-phase-swap subcircuit, the Earth-phase-swap subcircuit using a voltage between the virtual neutral signal and a signal at the ground contact in monitoring for the phase-ground swap fault.

15. The electrical connector of claim 13, further comprising a plurality of wiring terminals, wherein the detector is couped via a respective thermally conductive spring element to a respective wiring terminal of the plurality of wiring terminals.

16. The electrical connector of claim 13, further comprising:

a first circuit board, the first circuit board including the detector; and a second circuit board, the second circuit board including the indicator, wherein the second circuit board is coupled to the first circuit board, with the detector and the indicator being operatively connected.

17. The electrical connector of claim 16, further comprising a third circuit board, and wherein the second circuit board and the third circuit board each include two or more indicators of the plurality of indicators.

18. The electrical connector of claim 17, wherein the plurality of indicators comprise a plurality of light-indicators.

19. The electrical connector of claim 13, wherein the detector is further configured to monitor for a phase fault at any of the first phase contact, the second phase contact, or the third phase contact, as well as a ground fault at the ground contact.

\* \* \* \* \*